(12) United States Patent
Yamamoto et al.

(10) Patent No.: US 10,005,663 B2
(45) Date of Patent: Jun. 26, 2018

(54) METHOD OF MANUFACTURING PATTERN SUBSTRATE AND METHOD OF LOCATING COMPONENT

(71) Applicant: Konica Minolta, Inc., Tokyo (JP)

(72) Inventors: Naoki Yamamoto, Toyohashi (JP); Kanji Nakayama, Toyokawa (JP); Keita Saito, Toyokawa (JP); Dai Suwama, Toyokawa (JP)

(73) Assignee: KONICA MINOLTA, INC., Tokyo (JP)

( * ) Notice: Subject to any disclaimer, the term of this patent is extended or adjusted under 35 U.S.C. 154(b) by 627 days.

(21) Appl. No.: 14/295,753

(22) Filed: Jun. 4, 2014

(65) Prior Publication Data

US 2014/0360252 A1 Dec. 11, 2014

(30) Foreign Application Priority Data

Jun. 10, 2013 (JP) .................. 2013-121395

(51) Int. Cl.
*G03G 15/20* (2006.01)
*B81C 3/00* (2006.01)

(52) U.S. Cl.
CPC ........ *B81C 3/005* (2013.01); *B81C 2203/032* (2013.01); *H01L 2224/95146* (2013.01)

(58) Field of Classification Search
USPC .................................. 399/340, 341; 505/100
See application file for complete search history.

(56) References Cited

U.S. PATENT DOCUMENTS

2007/0217840 A1* 9/2007 Yamana ................. G03G 15/06
399/340

FOREIGN PATENT DOCUMENTS

JP 2005-317694 A 11/2005
JP 2011-227814 A 11/2011

* cited by examiner

*Primary Examiner* — Lam Nguyen
(74) *Attorney, Agent, or Firm* — Lucas & Mercanti, LLP

(57) ABSTRACT

There is provided a method of manufacturing a pattern substrate in which a pattern is formed on the surface of the substrate. The manufacturing method includes a step of preparing the substrate and a step of arranging a liquid-repellent or lyophilic material on the surface of the substrate so as to form the pattern on the surface of the substrate in which the surface of the substrate has a liquid-repellent region and a lyophilic region, the pattern is formed by one of the liquid-repellent region and the lyophilic region and the pattern is used to locate a component by the surface tension of a liquid member.

22 Claims, 6 Drawing Sheets

METHOD OF MANUFACTURING PATTERN SUBSTRATE AND METHOD OF LOCATING COMPONENT

This application is based on Japanese Patent Application No. 2013-121395 filed on Jun. 10, 2013 the contents of which are hereby incorporated by reference.

BACKGROUND OF THE INVENTION

Field of the Invention

The present invention relates to a method of manufacturing a pattern substrate and more particularly relates to, for example, a method of manufacturing a pattern substrate that is used to locate a component utilizing the surface tension of a liquid member.

Description of the Related Art

In recent years, researches on micro-mechanical systems called MEMS (Micro Electro Mechanical Systems) and micro-machines have been widely conducted In order to realize the micro-mechanical system formed with various components described above, it is necessary to provide an assembly system that can achieve mass production.

As a method of arranging a micro-component on a substrate, various types of researches on the autonomous locating of a micro-component are conducted. Specifically, researches utilizing a magnetic force and an electrostatic force, the surface tension of a molten solder, the surface tension of a liquid and the like are conducted.

However, with respect to the magnetic force, noise may be produced by a residual magnetic force. With respect to the electrostatic force, a component may be broken. Although advanced researches are conducted on the method utilizing the surface tension of a molten solder, and thus its practicality is high, a component vulnerable to heat cannot be used. In addition, a residual stress is disadvantageously produced by heat. On the other hand, in the method utilizing the surface tension of a liquid, there is no danger that the various components described above are damaged, and such a method is promising as the autonomous locating method (see, for example, Japanese Unexamined Patent Application No. 2005-317694 and Japanese Unexamined Patent Application No. 2011-227814).

In the autonomous locating method utilizing the surface tension of a liquid, in order to locate a micro-machine in a predetermined position on a substrate, it is necessary to perform lyophilic/liquid-repellent patterning on the surface of the substrate. Conventionally, as a method of performing the patterning described above, a method such as photolithography and etching is used. FIG. 11 shows a process chart of a conventional autonomous locating method utilizing the surface tension of a liquid.

A hydrophilic film 21 is first formed on a substrate B (FIG. 11A). Then, after a photoresist 22 is applied onto the hydrophilic film 21 (FIG. 11B), the substrate is set in an exposure device, and a mask pattern 23 is transferred. The exposed photoresist 22 is subjected to development processing (FIG. 11C), and the hydrophilic film 21 is etched according to the pattern of the photoresist 22 (FIG. 11D). Then, the photoresist 22 is separated, and thus on the substrate B, the hydrophilic film 21 where the pattern is formed is obtained (FIG. 11E). Then, in the same step as the pattern formation of the hydrophilic film 21, a liquid-repellent film 24 is formed on the substrate B (FIG. 11F).

When on the hydrophilic film 21 on the substrate 11 produced as described above, a liquid is applied, the liquid is spread but is prevented from being spread outside the liquid-repellent film 24, with the result that droplet 81 is formed (FIG. 11G). Then, when a component 9 is arranged so as to make contact with the droplet 81, the droplet 81 is spread even over the surface of the component 9 in contact with the droplet 81 (FIG. 11H), and thus the component 9 is autonomously located in a predetermined position by the surface tension of the droplet 81 (FIG. 11I).

As a method of adhering the located component 9 to the substrate B, there are various types of methods. The following three methods are typical adhering methods. In the first adhering method, as shown in FIG. 12, the hydrophilic film 21 of the substrate B is formed of $SiO_2$, a $SiO_2$ film 25 is formed on the surface of the component 9 in contact with the substrate B, water 82 to which an additive (such as hydrofluoric acid) for activating the $SiO_2$ film 21, 25 is added is used as a droplet, the water 82 is evaporated and thus hydrophilic groups (OH groups) formed on the $SiO_2$ film 21, 25 are coupled to each other. In the second adhering method, as shown in FIG. 13, water is used as the droplet 81, the water is evaporated and thereafter the periphery of the component 9 is fixed with an adhesive 26. In the third adhering method, as shown in FIG. 14, a droplet 83 containing an adhesive is used, the droplet 83 is dried and thus the substrate B and the component 9 are fixed.

Since in the method in which photolithography, etching and the like are used to perform patterning, it is necessary to use a mask or a plate, when the pattern is changed, time and money are disadvantageously needed. As a method of facilitating the change of the pattern, a method of controlling a liquid by arranging devices for generating electric and magnetic fields in a grid is proposed; however, disadvantageously, it is impossible to obtain only the accuracy of the locating lower than the size of the grid which can be produced, and as the region which can be controlled is made larger, the size of the device (circuit) is increased.

SUMMARY OF THE INVENTION

In view of the foregoing conventional problem, the present invention is made, and an object of the present invention is to provide a method of manufacturing a substrate on which a pattern for locating a component by the surface tension of a liquid member can be formed without use of a mask, a plate or the like.

Another object of the present invention is to provide a method in which even a minute component can be highly accurately located on a substrate.

According to the present invention, there is provided a method of manufacturing a pattern substrate in which a pattern is formed so as to locate a component in a predetermined position on the surface of the substrate by the surface tension of a liquid member, where the predetermined pattern is formed on the substrate with a liquid-repellent or lyophilic material such that the predetermined pattern is formed by one of a liquid-repellent region and a lyophilic region with respect to the other region.

Here, preferably, the material by which the predetermined pattern is formed is a particle.

Preferably, after the predetermined pattern is formed by the particle on the surface of a particle carrying member, the predetermined pattern is transferred from the particle carrying member to the substrate such that the predetermined pattern is formed on the substrate.

Preferably, a step of forming the predetermined pattern by the particle on the surface of the particle carrying member is such that an electrostatic latent image of the predetermined pattern is formed on the particle carrying member, that the charged particle is electrically moved to the electrostatic latent image and that the predetermined pattern by the particle is formed on the surface of the particle carrying member.

Preferably, the particle carrying member includes a photoconductive layer, and after the particle carrying member is uniformly charged, the electrostatic latent image of the predetermined pattern is formed by exposure on the surface of the particle carrying member.

Preferably, a step in which the predetermined pattern is transferred from the particle carrying member to the substrate is such that a voltage of a polarity opposite to a charge polarity of the particle is applied from a side of the substrate opposite to a side of the particle carrying member and that the predetermined pattern is electrically transferred from the particle carrying member to the substrate.

The predetermined pattern may be formed on the substrate with an ink jet application unit by the liquid-repellent or lyophilic material.

According to the present invention, there is provided a method of locating a component in a predetermined position on a surface of a substrate by a surface tension of a liquid member, where the liquid member is applied to the pattern substrate manufactured by the manufacturing method according to claim 1, and the component is arranged such that at least a part of a surface of the component opposite the pattern substrate is brought into contact with the liquid member to which the predetermined pattern is applied.

According to the present invention, there is provided a method of locating a component in a predetermined position on a surface of a substrate by a surface tension of a liquid member, where the liquid member is applied to at least a part of a surface of the component opposite the substrate, and the component is arranged such that at least a part of the liquid member applied is brought into contact with a lyophilic region on the pattern substrate manufactured by any one of the manufacturing methods described above.

Preferably, an angle of contact of the liquid member with a liquid-repellent region is greater than an angle of contact with the lyophilic region and an angle of contact of the component with the surface opposite the substrate.

Preferably, when the predetermined pattern is a negative pattern, the height of the liquid member applied to the substrate is higher than the height of a liquid-repellent material.

Preferably, when the predetermined pattern is a negative pattern, a liquid-repellent material is formed so as not to make contact with the component.

Preferably, the surface of the component opposite the substrate is subjected to lyophilic processing. A region of the component subjected to the lyophilic processing may be the part of the surface opposite the substrate.

Preferably, a lyophilic region on the pattern substrate is similar to the surface of the component opposite the substrate.

Preferably, a lyophilic region on the pattern substrate is similar to the region of the component subjected to the lyophilic processing.

Preferably, the liquid member has water as a main ingredient.

DESCRIPTION OF PREFERRED EMBODIMENTS

A method of manufacturing a pattern substrate and a method of locating a component according to the present invention will be described below with reference to accompanying drawings; the present invention is not limited at all to these embodiments.

Figure 1:
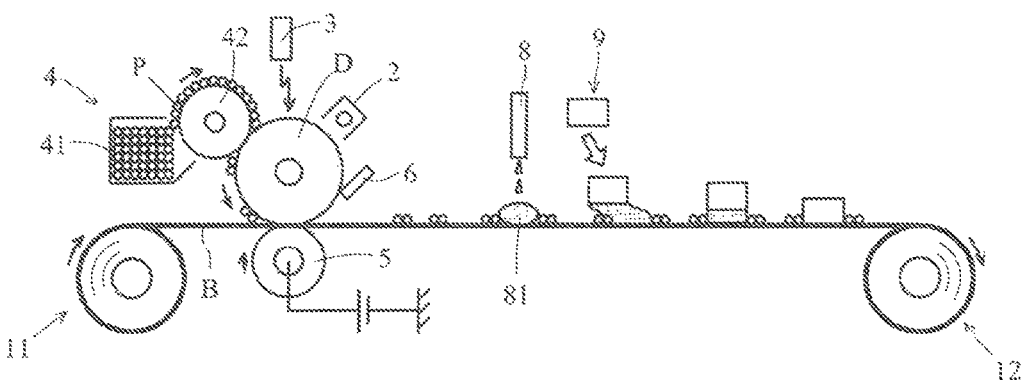
FIG. 1 A process chart showing an example of a method of manufacturing a pattern substrate and a method of locating a component according to the present invention.

FIG. 1 is a schematic diagram of a manufacturing device that can continuously perform a method of manufacturing a pattern substrate and a method of locating a component according to the present invention. The device of FIG. 1 includes, around a photoconductive member (particle carrying member) D that is driven to rotate counterclockwise: a charging device 2 that uniformly charges the surface of the photoconductive member D; an exposure device 3 that applies light to the surface of the photoconductive member D to form an electrostatic latent image of a predetermined pattern; a development device 4 that supplies particles (hereinafter, referred to as "liquid-repellent particles") P which are charged and liquid-repellent to the photoconductive member D, that develops the electrostatic latent image on the photoconductive member D and that forms the predetermined pattern; a transfer roller 5 that transfers the predetermined pattern on the photoconductive member D formed by the development device 4 to the substrate B; and a cleaning device 6 that removes the particles which are not transferred to the substrate B and which are left on the photoconductive member D.

The charging device 2 is a scorotron-type charging device; when a voltage of several thousands of volts is applied to a discharge electrode, corona discharge is produced, and thus the surface of the photoconductive member D is uniformly charged. The type of the charging device 2 is not particularly limited, and a roller-type charging member, a blade-shaped charging member, a brush-shaped charging member or the like may naturally be used.

The exposure device 3 selectively applies light to the surface of the photoconductive member D uniformly charged by the charging device 2 based on, for example, pattern image data input from an external device such as a personal computer to perform exposure and thereby forms the electrostatic latent image of the predetermined pattern on the surface of the photoconductive member D. As a light source of the exposure device, it is possible to use a laser, an LED or the like that can be turned on and off. As an exposure scanning method, there are a method of scanning light having a high linearity from a single light source with a polygon mirror in a main scanning direction, a method of arranging a plurality of light sources in a main scanning direction and focusing the light from the light sources to the surface of a photoconductive member with a SLA (SELFOC (registered trade mark) Lens Array) and the like.

The development device 4 includes a housing 41 and a development roller 42 that is rotatably provided opposite the photoconductive member D. Within the housing 41, a developer formed with the liquid-repellent particles P and semiconductive particles (hereinafter, referred to as "carrier particles") having different triboelectric series from the liquid-repellent particles P is stored. The liquid-repellent particles P and the carrier particles are mixed and agitated, and thus the liquid-repellent particles P are charged.

The average diameter of the liquid-repellent particle P used in the present invention preferably falls within a range of 1 μm to 10 μm, and is more preferably about 6 μm in terms of responsiveness and safety for electric field. The shape of the liquid-repellent particle P is preferably a sphere having a degree of circularity of 0.8 or more. As a method of manufacturing the liquid-repellent particles P described above, for example, the following method is used.

1. A bisphenol-based polyester having a weight average molecular weight of 400000 and a number average molecular weight of 8000 is kneaded at a temperature of 200° C., is ground with a jet mill and is classified with an air classifier, with the result that particles having an average diameter of 6 μm are obtained. These particles are processed at a temperature of 300° C. with a surfusion system made by Nippon Pneumatic Mfg. Co., Ltd. 1% of colloidal silica subjected to hydrophobic processing of an average particle diameter of 60 nm is mixed with the obtained particles with a Henschel mixer, and thus the liquid-repellent particles P are obtained.

2. The liquid-repellent particles P are obtained using a styrene butyl-methacrylate methacrylate copolymer resin having a weight average molecular weight of 500000 and a number average molecular weight of 10000 in the same method as in (1). As a charge control agent, the amount of colloidal silica is set at 3%.

3. The liquid-repellent particles P are obtained by adding 3% of alumina having an average particle diameter of 80 nm to "Leblond L5" made by Daikin Industries Ltd. and processing it. The alumina is added and processed because excessive negative-charging of PTFE (polytetrafluoroethylene) is reduced.

4. The liquid-repellent particles P are obtained by processing 3% of silica subjected to amino silane coupling processing of an average particle diameter of 60 nm on "Leblond L5" made by Daikin Industries Ltd. The amino silane coupling processing is performed because excessive negative-charging of PTFE is reduced.

5. Silica particles coated with PTFE are obtained by mixing 5% of "Leblond L5" made by Daikin Industries Ltd. with silica particles of 5 nm, and thereafter processing it with a hybridizer of Nara Machinery Co., Ltd. The same method as in (1) is performed on the particles to obtain the liquid-repellent particles P. It is possible to use, instead of the hybridizer, a conventionally known surface modification device such as Angmill made by Hosokawa Micron Corporation or Mechanomill made by Tokuju Co., Ltd.

6. Silica particles coated with PTFE are obtained by mixing 5% of "Leblond L5" made by Daikin Industries Ltd. with alumina particles of 5 nm, and thereafter processing it with a hybridizer of Nara Machinery Co., Ltd. The same method as in (1) is performed on the particles to obtain the liquid-repellent particles P. It is possible to use, as a surface modification device, a conventionally known one.

7. A bisphenol-based polyester resin having a weight average molecular weight of 200000 and a number average molecular weight of 10000 is dissolved in an ethyl acetate solution obtained by mixing 25% of methanol, and is a 20% solution is prepared. This solution is injected, from a nozzle to which a voltage of 6 kV is applied, into hot air of 200° C., and thus particles having a uniform diameter of 6 μm are obtained. 1% of colloidal silica subjected to hydrophobic processing of an average particle diameter of 60 nm is implanted into the obtained particles with a hybridizer of Nara Machinery Co., Ltd., and thus the liquid-repellent particles P are obtained.

On the other hand, in the case of lyophilic particles, for example, it is possible to manufacture them in the following methods. It is naturally also possible to use, as the lyophilic particles, colloidal silica, alumina or other metal oxide particles.

8. 20% of colloidal silica of 60 nm is mixed with a toner for "Bizhub C650" made by Konica Minolta, Inc., and is processed with a hybridizer of Nara Machinery Co., Ltd., with the result that particles are obtained. The same method as in (1) is performed on the particles to obtain the lyophilic particles. It is possible to use, as a surface modification device, a conventionally known one.

9. 20% of colloidal silica of an average particle diameter of 60 nm is mixed with "Leblond L5" made by Daikin Industries Ltd., and is thereafter implanted with a hybridizer of Nara Machinery Co., Ltd., with the result that the lyophilic particles are obtained. It is possible to use, as a surface modification device, a conventionally known one.

10. A bisphenol-based polyester having a weight average molecular weight of 400000 and a number average molecular weight of 8000 is kneaded at a temperature of 200° C., is ground with a jet mill and is classified with an air classifier, with the result that particles having an average diameter of 6 μm are obtained. These particles are processed at a temperature of 300° C. with a surfusion system made by Nippon Pneumatic Mfg. Co., Ltd. 20% of colloidal silica of an average particle diameter of 60 nm is mixed with the obtained particles, and is thereafter implanted with a hybridizer of Nara Machinery Co., Ltd., with the result that the lyophilic particles of a polyester coated with silica are obtained. It is possible to use, as a surface modification device, a conventionally known one.

11. A styrene butyl-methacrylate copolymer resin having a weight average molecular weight of 500000 and a number average molecular weight of 10000 is kneaded at a temperature of 200° C., is ground with a jet mill and is classified with an air classifier, with the result that particles having an average diameter of 6 µm are obtained. These particles are processed at a temperature of 300° C. with a surfusion system made by Nippon Pneumatic Mfg. Co., Ltd. 15% of colloidal silica of an average particle diameter of 60 nm is mixed with the obtained particles, and is thereafter implanted with a hybridizer of Nara Machinery Co., Ltd., with the result that the lyophilic particles of a polyester coated with silica are obtained. It is possible to use, as a surface modification device, a conventionally known one.

Although the amount of charging of the liquid-repellent particles P is not particularly limited, in general, its absolute value preferably falls within a range of 10 µC/g to 50 µC/g. More preferably, its absolute value is about 30 µC/g in terms of electrolytic response. The amount of charging of the liquid-repellent particles P can be controlled by changing, for example, a mixing ratio between the liquid-repellent particles P and the carrier particles.

As the carrier particle used, particles having a degree of circularity of 0.9 or more and magnetism are preferably used. When the carrier particles have magnetism, it is possible to transport the particles by utilizing magnetism. The average diameter of the carrier particle preferably falls within a range of 10 µm to 100 µm, and is more preferably about 30 µm in terms of charging property and magnetic force. As the carrier particle described above, for example, a coating carrier is recommended in which ferrite particles are used as a core member and in which a resin coating having a thickness of about 1 µm is formed on its surface.

The development roller 42 includes a rotatable and non-magnetic sleeve and a magnet that is incorporated and fixed in the sleeve. The sleeve is rotated, and thus the carrier particles having magnetism and the liquid-repellent particles P adhered to the carrier particles are transported to a portion (development portion) opposite the photoconductive member D. The amount of transport of the developer to the development portion may be controlled by providing a restriction member on the upstream side in the direction of rotation of the photoconductive member with respect to the development portion such that a predetermined space is formed with the surface of the development roller 42.

The development of the electrostatic latent image on the photoconductive member D by the liquid-repellent particles P is performed by application of a development bias voltage to the development roller 42. Specifically, when the development bias voltage is applied to the development roller 42, a potential difference is produced between the voltage applied to the development roller 42 and the electrostatic latent image on the photoconductive member D, and the liquid-repellent particles P are moved to the photoconductive member D based on this potential difference, with the result that the electrostatic latent image on the photoconductive member D is visualized (patterned) by the liquid-repellent particles P.

The development bias voltage is preferably set such that a potential difference of about 100 V to 1000 V with the electrostatic latent image can be produced. The development bias voltage can be preferably adjusted as necessary by a bias adjustment mechanism so that the desired amount of development is obtained and that a failure such as leakage is prevented from occurring. An alternating-current voltage (a sine wave, a rectangular wave, a triangular wave or a combination thereof) may be superimposed on the development bias voltage. Thus, it is possible to perform highly accurate development.

It is also possible to charge the liquid-repellent particles P without using the carrier particles to develop the electrostatic latent image. For example, as the development roller 42, a development roller in which an elastic layer is formed on its surface is used, the liquid-repellent particles P are brought into contact with the restriction member and thus frictional charging is performed. Then, as in the case of using the carrier particles, the development bias voltage is applied to the development roller 42, the liquid-repellent particles P are moved to the photoconductive member D by the potential difference between the development bias voltage and the electrostatic latent image, with the result that the electrostatic latent image on the photoconductive member D is developed by the liquid-repellent particles P.

The transfer roller 5 is provided such that it can be rotated by a drive motor (not shown) coupled to the transfer roller 5, and is pressed onto the photoconductive member D through the substrate B by a force application member (not shown). A voltage of a polarity opposite to the charge polarity of the liquid-repellent particles P is applied by an unillustrated voltage application unit to the transfer roller 5. When the substrate B passes between the photoconductive member D and the transfer roller 5, the above voltage is applied to the transfer roller 5, and the pattern by the liquid-repellent particles P formed on the photoconductive member D is transferred to the substrate B.

The transfer voltage preferably falls within a range of 100 V to 1000 V, and can be preferably adjusted as necessary such that a satisfactory transferred member can be maintained. The transfer voltage is preferably controlled (constant voltage control) such that the amount of current is constant.

The cleaning device 6 is a cleaning blade that is pressed onto the photoconductive member D, and removes, from the photoconductive member D, the liquid-repellent particles P that are left on the surface of the photoconductive member D and that are not transferred.

The substrate B that is wound in the shape of a roll and that is flexible is set in an unwinding portion 11. The substrate B that is unwound from the unwinding portion 11 passes through the nip portion between the photoconductive member D and the transfer roller 5, and is wound by a winding portion 12 in the shape of a roll. As described above, in the nip portion between the photoconductive member D and the transfer roller 5, the pattern of the liquid-repellent particles P is transferred from the photoconductive member D to the substrate B.

Since with respect to the substrate B used in the present invention, as described above, the pattern of the liquid-repellent particles P is transferred by a potential difference from the photoconductive member D to the substrate B, the substrate B is preferably a sheet that has insulation properties (high resistance). When the liquid-repellent particles P are fixed by being heated, the substrate B also needs to have heat resistance. Specifically, a sheet, such as PET or PI, that has high heat resistance is preferably used.

The liquid-repellent particles P are fixed to the substrate B by electrostatic adherence. In a case where the liquid-repellent particles P are fixed to the substrate B only by electrostatic adherence described above, when the liquid-repellent particles P are not needed in the subsequent step, it is possible to remove and collect the liquid-repellent particles P from the substrate B either with the same mechanism as in the transfer step or by blowing air.

Depending on the droplet 81 and a droplet application unit 8 used, the liquid-repellent particles P may be fixed insufficiently only by electrostatic adherence, and the liquid-repellent particles P may be moved. In that case, on the upstream side in the direction of transport of the substrate B with respect to the droplet application unit 8, the liquid-repellent particles P are preferably fixed to the substrate B. As the fixing method, for example, there is a method of heating and pressurizing the liquid-repellent particles P to melt and fix then to the substrate B. As the heating unit, a flash lamp, a halogen heater or the like can be used. As the pressurizing unit, a roller pair that presses the substrate B on which the liquid-repellent particles P are placed in the nip portion to rotate and transport it or the like can be used. Furthermore, as another fixing method, there is a method of applying an adhesive to the liquid-repellent particles P such as by ink jetting. In that case, it is necessary to use, as the adhesive, a material having a high affinity for the liquid-repellent particles P.

When the charge on the liquid-repellent particles P may adversely affect the post steps and the component 9, it is preferable to neutralize the pattern with a neutralization unit. As the neutralization unit, for example, there is a corona charger that generates both positive and negative ions or the like.

In the steps described above, the substrate is produced in which a predetermined pattern for applying a predetermined liquid member is formed on its surface. In the embodiment shown in FIG. 1, although the substrate is continuously transported to the subsequent step, an ink (liquid member) application step, the substrate on which the predetermined pattern is produced on the surface may be temporarily wound or may be divided into a predetermined shape.

In the present embodiment, since the liquid-repellent particles P are used, the pattern formed with the liquid-repellent particles P is a negative pattern (the pattern in which the pattern of the liquid member is surrounded by the liquid-repellent particles). On the other hand, when the lyophilic particles are used, the pattern formed with the lyophilic particles is a positive pattern (the pattern in which the pattern of the liquid member is the same as that formed with the liquid-repellent particles).

Then, the liquid member is discharged from the droplet application unit 8 into a region of the pattern substrate that is surrounded by the liquid-repellent particles P to supply the droplet 81 to the region. Here, preferably, the angle of contact of the droplet 81 with the liquid-repellent particles P is more than 90°, and the angle of contact with the substrate B is less than 90°. Thus, the droplet 81 dropped onto the region surrounded by the liquid-repellent particles P, that is, the region where the substrate B is exposed is continuously extended by its surface tension while having a high adhesion to the substrate B. On the other hand, the droplet 81 dropped onto a boundary part with the liquid-repellent particles P is repelled by the liquid-repellent particles P and is drawn by the surface tension into the region where the lyophilic substrate B is exposed. Hence, even if the position onto which the droplet is dropped is slightly displaced, the droplet 81 is moved to the region surrounded by the liquid-repellent particles P without fail, with the result that it is possible to stably form a fine pattern. It is also possible to increase the thickness of the coating film of the droplet 81.

The droplet 81 applied preferably has water as the main ingredient. When the main ingredient is water, the surface tension obtained is great, and environmental contamination is prevented. Since water can be evaporated, after the location of the component, the distance between the substrate B and the component 9 is reduced to zero. As the liquid member used in the present invention, instead of water, an inorganic or organic liquid can be used. For example, a liquid such as glycerin, acetone or alcohol, a resin in a liquid state or a mixture liquid between a resin in a liquid state and water may be used. However, the viscosity of the liquid member needs to be low to such a degree that it is possible to locate the component.

In order to satisfactorily perform the application of the droplet and the arrangement of the component described later, the angle of contact of the droplet 81 with the liquid-repellent particles P needs to be more than the angle of contact of the droplet 81 with the substrate B and the angle of contact of the droplet 81 with the surface of the component 9 in contact with the substrate. The angle of contact of the droplet 81 with the liquid-repellent particles P refers to a contact angle that is measured after the application of the droplet 81 to the liquid-repellent particles P which have been molted into the state of a flat plate.

Although as the droplet application unit 8 of the droplet 81, a conventionally known application unit such as an ink jet method or a dispenser can be used, the ink jet method is preferably used in terms of excellent variable on-demand properties. When the liquid-repellent particles P are fixed to the substrate, it is also possible to apply the droplet 81 to the region of the pattern substrate surrounded by the liquid-repellent particles P by making the substrate B pass through a liquid chamber in which the liquid member is put.

Then, the component 9 is arranged on the droplet 81 formed in the region surrounded by the liquid-repellent particles P. Specifically, the component 9 is arranged such that at least a part of the surface of the component 9 opposite the substrate B is brought into contact with the droplet 81. Accordingly, the droplet 81 is spread over the surface of the component 9 opposite the substrate B. Then, the component 9 is autonomously located, by the surface tension of the droplet 81, in the region surrounded by the liquid-repellent particles P.

Figure 2A:
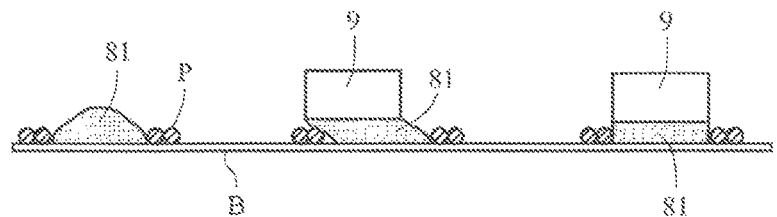
FIG. 2A and FIG. 2B A diagram showing a state where a droplet 81 has been applied to a substrate B.
Figure 2B:
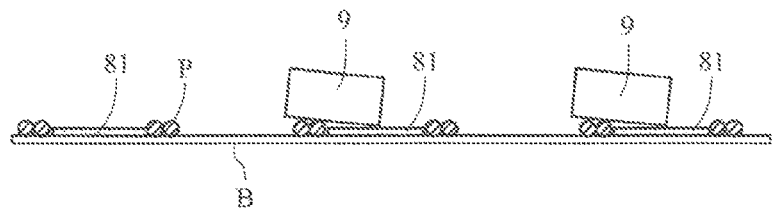

FIG. 2 is a diagram showing a state where the droplet 81 has been applied to the substrate B. As shown in FIG. 2A, the height of the droplet 81 is greater than that of the liquid-repellent particles P. The droplet 81 is set higher than the liquid-repellent particles P, and thus the component 9 can be floated on the droplet 81, with the result that it is possible to locate the component by the surface tension without being affected by the friction force. By contrast, as shown in FIG. 2B, when the height of the droplet 81 is lower than that of the liquid-repellent particles P, the component 9 arranged may be brought into contact with the liquid-repellent particles P or the substrate B, with the result that if the surface tension of the droplet 81 is greater than the friction force with the liquid-repellent particles P or the like, it is impossible to locate the component 9.

The lyophilic region surrounded by the liquid-repellent particles P is preferably similar to the surface of the component 9 opposite the substrate B. More preferably, they have the same shape. Even if they are not similar, it is possible to perform the location but it is necessary to previously calculate (predict) in what position and in what direction the component 9 is balanced with the shape on the side of the substrate B and the surface tension is balanced. The lyophilic region surrounded by the liquid-repellent particles P is similar or has the same shape to or as the surface of the component 9 opposite the substrate B, and thus it is possible to easily determine the position of the component 9 in which the surface tension is balanced and to control the direction in which the component is attached.

As the method of adhering the located component 9 to the substrate B, a conventionally known method can be used. For example, it is possible to use a method of coupling hydrophilic groups on the contact surface described above, a method of fixing the periphery of the component 9 with an adhesive, a method of using, as the droplet 81, a liquid containing an adhesive or the like.

Figure 3:
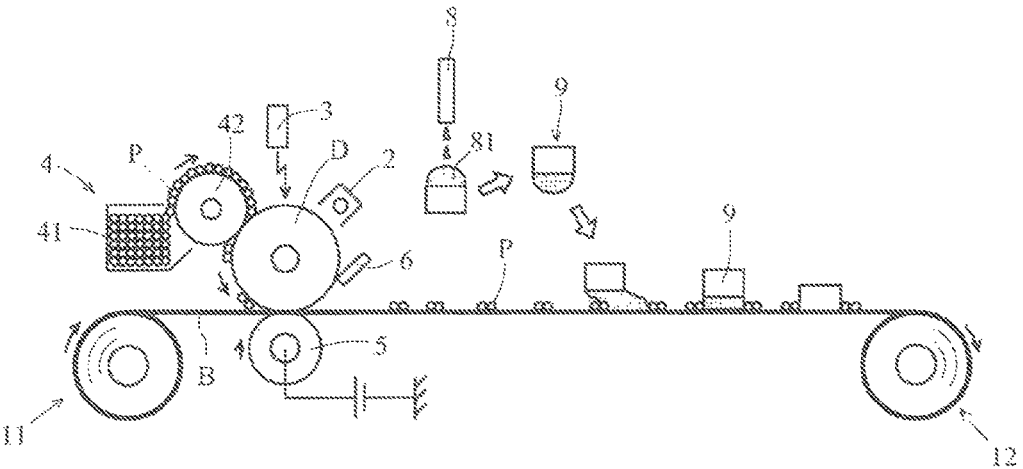
FIG. 3 A schematic diagram of a device that can continuously perform another method of manufacturing the pattern substrate and another method of locating the component according to the present invention.

FIG. 3 shows another embodiment of the method of locating the component according to the present invention. The method of locating the component shown in this figure differs from the method of locating the component shown in FIG. 1 in that the droplet 81 is applied by the droplet application unit 8 to the surface of the component 9 in contact with the substrate B. As the droplet application unit 8, as in the first embodiment, an application device such as an ink jet or a dispenser can be used. It is also possible to apply the droplet 81 to the component 9 by passing the component 9 through a liquid chamber in which the droplet 81 is put.

After the application of the droplet 81 to the component 9, the component 9 is arranged such that the droplet 81 applied to the component 9 makes contact with the lyophilic region on the substrate B surrounded by the liquid-repellent particles P. Although the droplet 81 is spread over the substrate B, since the lyophilic region is surrounded by the liquid-repellent particles P, the droplet 81 is prevented from being spread outside the liquid-repellent particles P. The component 9 is autonomously located, by the surface tension of the droplet 81, in the lyophilic region surrounded by the liquid-repellent particles P. The adhesion of the component 9 to the substrate B is performed as in the embodiment described above.

Figure 4:
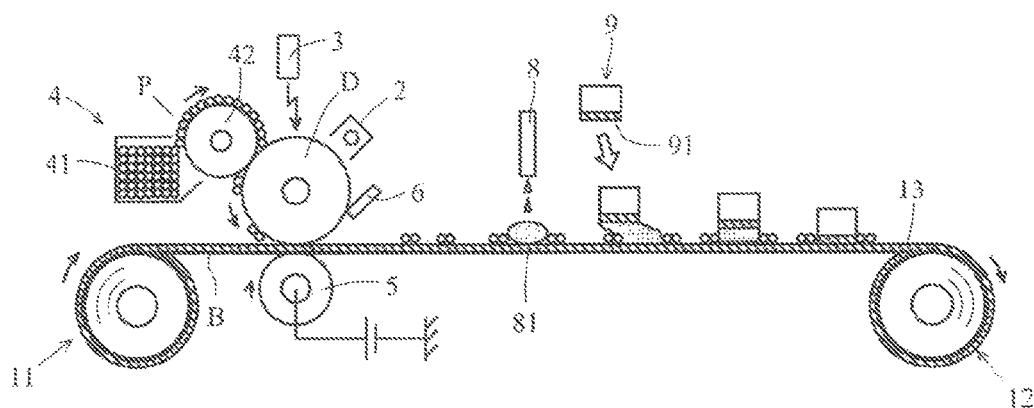
FIG. 4 A process chart showing another example of the method of manufacturing the pattern substrate and the method of locating the component according to the present invention.

FIG. 4 shows yet another embodiment of the method of locating the component according to the present invention. The method of locating the component shown in this figure differs from the method of locating the component shown in FIG. 1 in that on the contact surfaces of the substrate B and the component 9, a lyophilic film 13 and a lyophilic film 91 are formed. The lyophilic films are formed, and thus the contrast of wettability is increased, with the result that it is possible to more reliably locate the component. The lyophilic film 13 may previously be formed over the entire surface of the substrate B.

Examples of the lyophilic films 13 and 91 include two-layer films of $SiO_2$, $Si_2N_4$, aluminum and alumina, a two-layer film of tantalum and tantalum oxide and like. As the method of forming the lyophilic film, a known method such as a thermal oxidation method, a CVD method or a sputtering method is preferably used. As in the embodiment described previously, the angle of contact of the droplet 81 with the liquid-repellent particles P needs to be greater than the angle of contact of the droplet 81 with the lyophilic film.

Figure 5A:
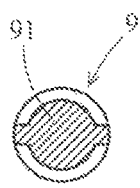
FIG. 5A and FIG. 5B A plan view showing an example of the shape of a lyophilic film formed on the component and the substrate.
Figure 5B:
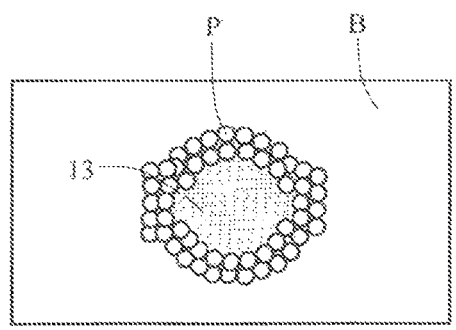

As shown in FIG. 5A, the lyophilic film 91 may be partially formed on the surface of the component 9 in contact with the substrate B. When the surface of the component 9 in contact with the substrate B is, for example, circular, if the lyophilic film is formed over the entire surface, it is impossible to determine the direction of the component 9 with respect to the substrate B. However, as shown in FIG. 5A, the lyophilic film 91 is shaped so as to have circular portions protruding outward from positions opposite each other, and thus it is possible to determine the direction of the component 9. In this case, as shown in FIG. 5B, the lyophilic region on the substrate B surrounded by the liquid-repellent particles P is preferably similar in shape to the lyophilic film 91.

Figure 6A:
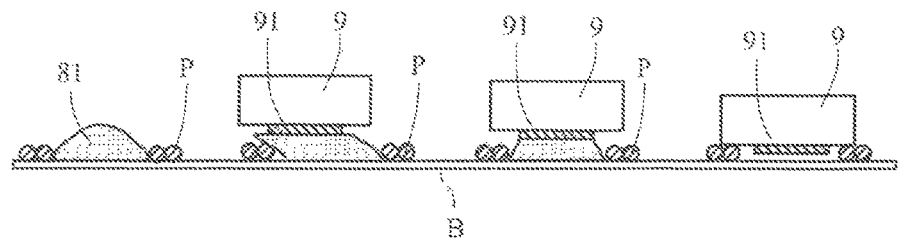
FIG. 6A and FIG. 6B A diagram showing a relationship between the shape of the component and the size of a lyophilic region surrounded by liquid-repellent particles.
Figure 6B:
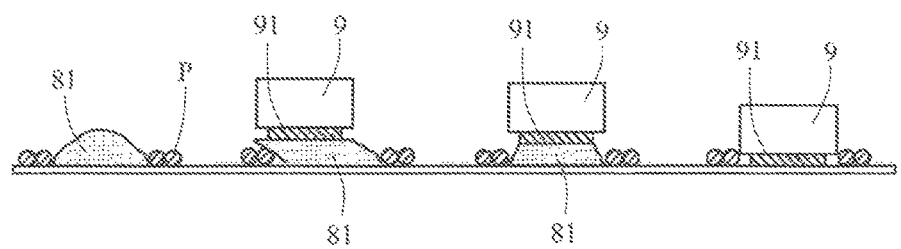

When as shown in FIG. 6A, the lyophilic film 91 is partially formed on the surface of the component 9 in contact with the substrate B, a part of the component 9 on which the lyophilic film 91 is not formed may be brought into contact with the liquid-repellent particles P. Hence, as shown in FIG. 6B, the lyophilic region surrounded by the liquid-repellent particles P needs to be formed on the substrate B such that the component 9 is prevented from being brought into contact with the liquid-repellent particles P.

Figure 7:
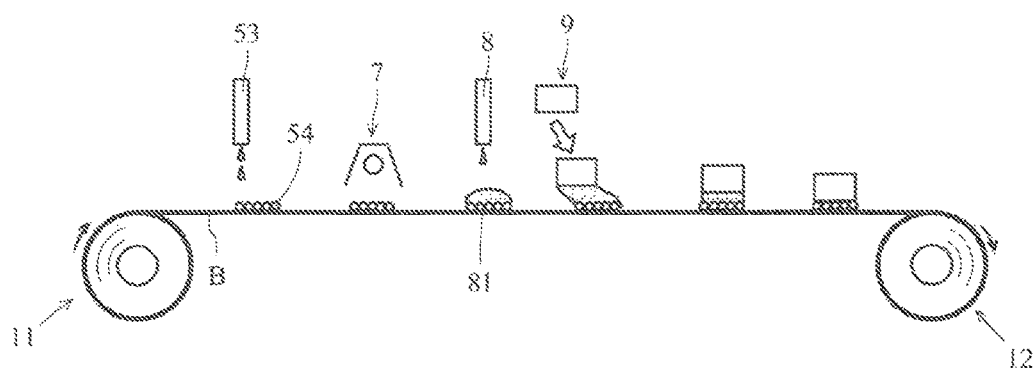
FIG. 7 A process chart showing another embodiment of the method of manufacturing the pattern substrate according to the present invention.
Figure 8:
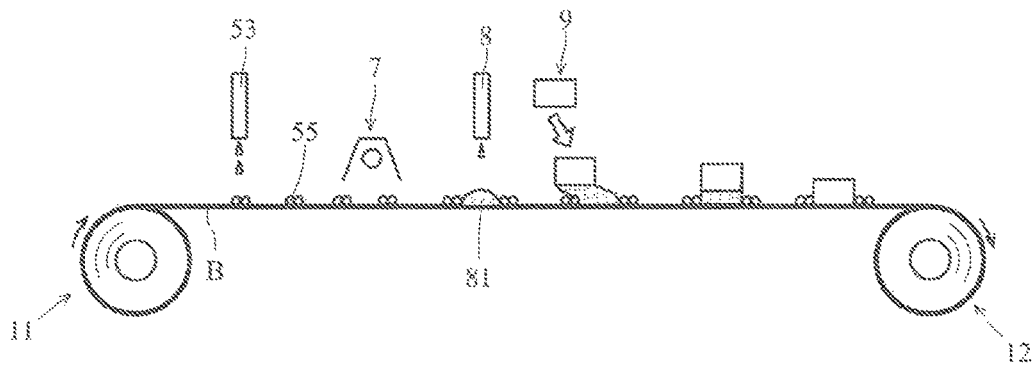
FIG. 8 A process chart showing another embodiment of the method of manufacturing the pattern substrate according to the present invention.

FIGS. 7 and 8 show another embodiment of the method of manufacturing the pattern substrate according to the present invention. In the method of manufacturing the pattern substrate shown in these figure, the pattern is directly formed on the surface of the substrate B by an ink jet device (ink jet application unit) 53. Here, with respect to an ink 54, 55 used, the angle of contact of the droplet 81 with the dried ink preferably differs from the angle of contact of the droplet 81 with the surface of the substrate B, and when the angle of contact of the droplet 81 with the ink is less than that with the surface of the substrate B, as shown in FIG. 7, the ink 54 is applied to the region where the component 9 is arranged. By contrast, when the angle of contact of the droplet 81 with the ink is greater than that with the surface of the substrate B, as shown in FIG. 8, the ink 55 is applied to the region surrounding the region where the component 9 is arranged. Then, as necessary, the applied ink 53, 55 is dried by a drying device 7. In order for the angle of contact of the droplet 81 when the ink is dried to be made to differ from the surface on the substrate B, not only the material of the ink may be different from that of the surface of the substrate B but also recesses and projections may be formed in the surface of the ink with a UV curing ink. In this case, as the drying device, a UV application device is used to apply UV light to the ink. Since in the method of directly forming the pattern on the surface of the substrate B with the ink jet device 53, the ink 54, 55 applied to the substrate B is spread over the surface of the substrate B after the ink is dropped, as compared with the embodiments described above, the positional accuracy may be degraded.

Figure 9:
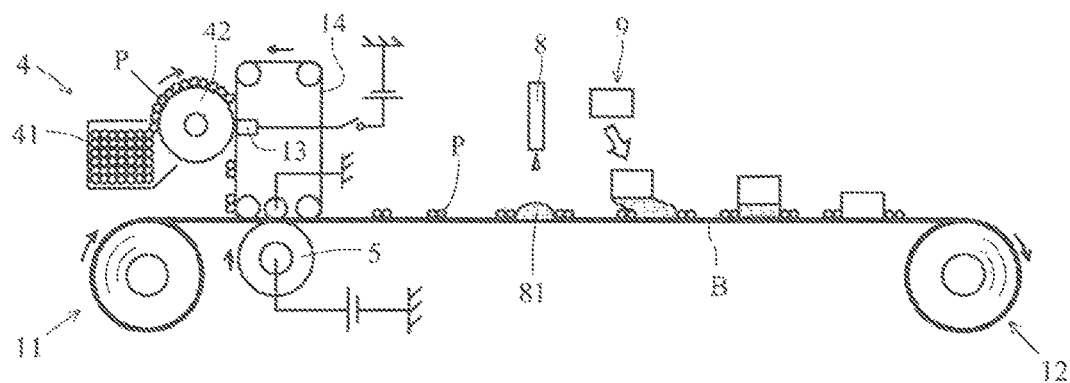
FIG. 9 A process chart showing another embodiment of the method of manufacturing the pattern substrate according to the present invention.

FIG. 9 shows yet another embodiment of the method of manufacturing the pattern substrate according to the present invention. The manufacturing method shown in FIG. 9 differs from that shown in FIG. 1 in the step of forming the pattern by the liquid-repellent particles P. Specifically, in the manufacturing method shown in FIG. 9, an endless intermediate transfer belt (particle carrying member) 14 that is freely rotated is used, and in a position opposite the development roller 42 through the intermediate transfer belt 14, a plurality of electrodes 13 are arranged in the direction of the shaft of the development roller 42 with the same pitch. These electrodes 13 can be individually controlled by the development bias voltage.

The development bias voltage of a polarity opposite to the charge polarity of the liquid-repellent particles P is selectively applied to these electrodes 13 based on, for example, pattern image data input from an external device such as a personal computer, and thus the liquid-repellent particles P are moved to the intermediate transfer belt 14, with the result that the predetermined pattern is formed. The pattern formed on the intermediate transfer belt 14 by the liquid-repellent particles P is transported to the nip portion with the transfer roller 5 by the rotation of the intermediate transfer belt 14, and is transferred to the substrate B as in the embodiment described previously. The subsequent steps are the same as in the embodiment of FIG. 1.

In the manufacturing method shown in FIG. 9, it is not necessary to form an electrostatic latent image on the intermediate transfer belt 14, and as compared with the manufacturing method of FIG. 1, the charging step and the exposure step are not needed, and it is easy to achieve the reduction and the simplification of the device mechanism. If the efficiency of the transfer can be increased close to 100%, the cleaning step of the intermediate transfer belt 14 can be omitted. In order to increase the efficiency of the transfer, it is preferable for a transfer portion to apply, to the liquid-repellent particles P, a transfer force higher than an adherence force exerted between the liquid-repellent particles P and the intermediate transfer belt 14. Preferably, in the embodiment shown in FIG. 9, since the charged liquid-repellent particles P are transferred by Coulomb's force, the width of the nip in the transfer portion is increased, and a sufficient transfer bias voltage is applied with the intermediate transfer belt 14 being previously in intimate contact with the substrate B. In this way, it is possible to generate a necessary electric field while reducing a failure such as discharge noise, with the result that reliable transfer can be achieved.

Figure 10:
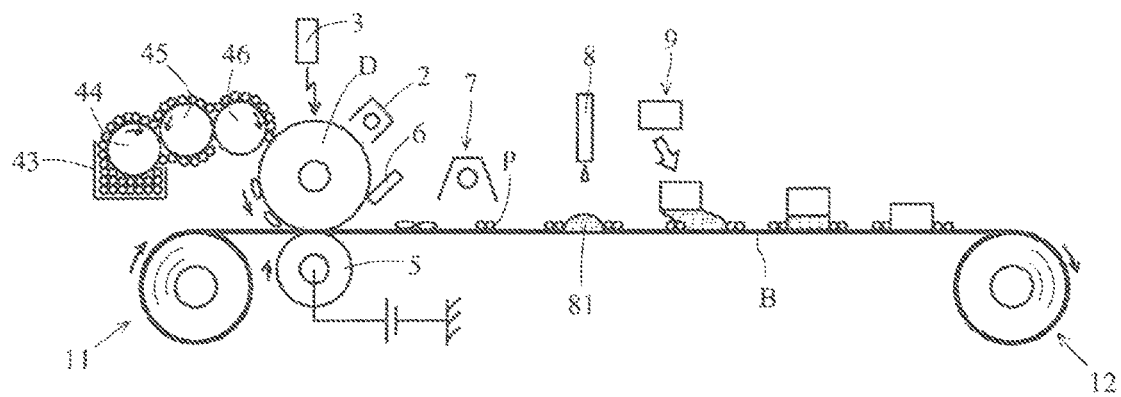
FIG. 10 A process chart showing another embodiment of the method of manufacturing the pattern substrate according to the present invention.
Figure 11A:
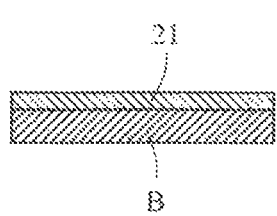
FIG. 11A, FIG. 11B, FIG. 11C, FIG. 11D, FIG. 11E, FIG. 11F, FIG. 11G, FIG. 11H and FIG. 11I A process chart of a conventional autonomous locating method utilizing the surface tension of a liquid.
Figure 11B:
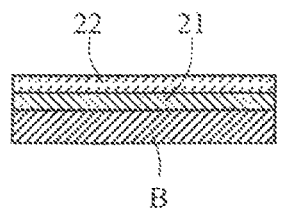
Figure 11C:
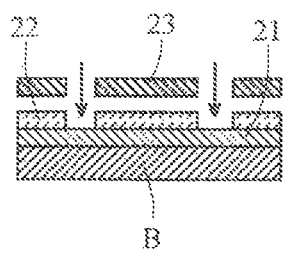
Figure 11D:
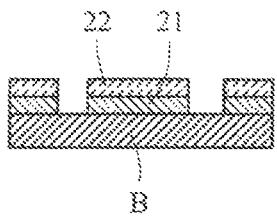
Figure 11E:
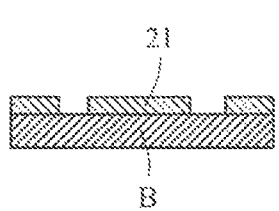
Figure 11F:
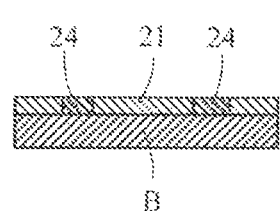
Figure 11G:
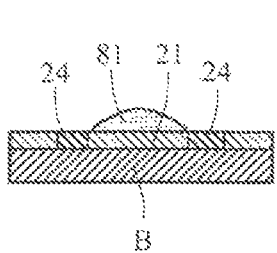
Figure 11H:
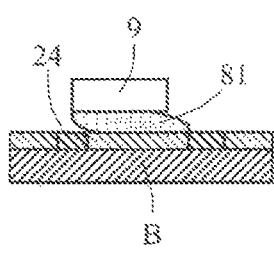
Figure 11I:
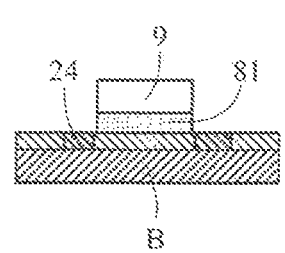
Figure 12A:
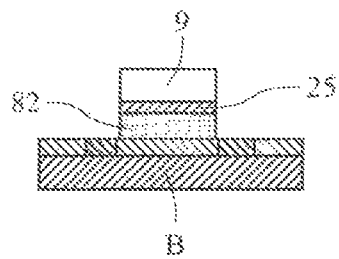
FIG. 12A and FIG. 12B A process chart showing an example of a method of adhering a component 9 to the substrate B after the locating.
Figure 12B:
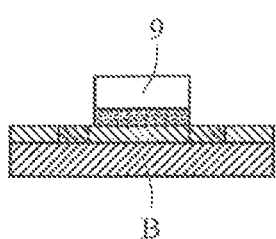
Figure 13A:
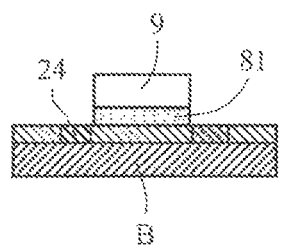
FIG. 13A, FIG. 13B and FIG. 13C A process chart showing another example of the method of adhering the component 9 to the substrate B after the locating.
Figure 13B:
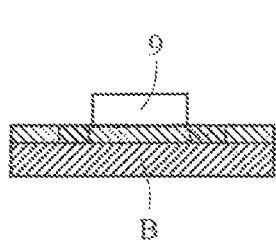
Figure 13C:
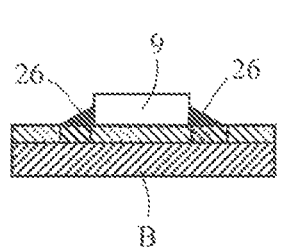
Figure 14A:
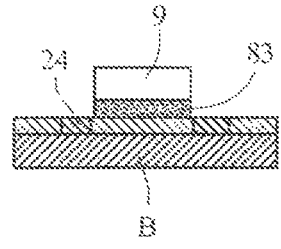
FIG. 14A and FIG. 14B A process chart showing another example of the method of adhering the component 9 to the substrate B after the locating.
Figure 14B:
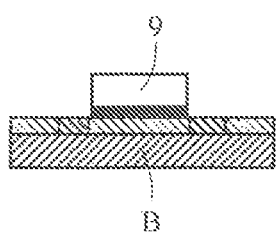

FIG. 10 is a schematic diagram showing yet another embodiment of the method of manufacturing the pattern substrate according to the present invention. The manufacturing method shown in FIG. 10 differs from that shown in FIG. 1 in the development method. Specifically, the development method shown in FIG. 1 is a dry-type development method whereas the development method shown in FIG. 10 is a wet-type development method. In the wet-type development method, as compared with the dry-type development method, liquid-repellent particles P having a lower diameter can be used. With the liquid-repellent particles P having a lower diameter, it is possible to obtain a pattern of high resolution. Since the developer is liquid, it is also possible to obtain a pattern that has a high liquidity and is uniform.

A development device shown in FIG. 10 includes: a development roller 46 that is pressurized into contact with the photoconductive member D; a development chamber 43 that stores the liquid developer containing the liquid-repellent particles P and a carrier liquid (not shown); a drawing-up roller 44 that is partially immersed in the development chamber 43 and that draws up the liquid developer; and a supply roller 45 that supplies the liquid developer drawn up by the drawing-up roller 44 to the development roller 46.

The drawing-up roller 44 and the supply roller 45, which are adjacent to each other, are rotated in the same direction at the contact region. The drawing-up roller 44 is rotated by the movement of the supply roller 45. The supply roller 45 and the development roller 46, which are adjacent to each other, are rotated in the directions opposite to each other at the contact region. The rotation in the opposite directions makes it possible to efficiently supply the liquid developer from the supply roller 45 to the development roller 46. It is also possible to make the thin layer of the development roller 46 uniform.

Preferably, as the drawing-up roller 44, a metal roller (anilox roller) in which a concave portion is provided in its surface is used, and thus the amount of liquid developer is accurately restricted.

Around the development roller 46, a charging device (not shown) is provided, and charge is fed by the charging device to the liquid-repellent particles P contained in the liquid developer on the development roller 46. Then, the development bias voltage is applied to the development roller 46, and thus the charged liquid-repellent particles P are moved from the development roller 46 to the photoconductive member D, and an electrostatic latent image on the photoconductive member D is developed.

A pattern formed on the photoconductive member D by the liquid-repellent particles P is transferred to the substrate B, and is thereafter heated by the drying device 7, and thus the carrier liquid is removed by being evaporated. It is not necessary to completely remove the carrier liquid. The subsequent steps are the same as in the embodiment of FIG. 1.

Although in each of the embodiments shown in FIGS. 9 and 10, the pattern is formed by the liquid-repellent particles P, a pattern may be formed by the lyophilic particles. In this case, the pattern formed on the substrate B by the lyophilic particles is a positive pattern, and the droplet 81 is applied onto the pattern. Here, preferably, the angle of contact of the droplet 81 with the lyophilic particles is less than 90°, and the angle of contact with the substrate B is more than 90°. Thus, the droplet 81 dropped onto the region formed by the lyophilic particles is exposed continuously by its surface tension while having a high adhesion to the lyophilic particles. On the other hand, the droplet 81 dropped onto a boundary part between the region to which the substrate B is exposed and the lyophilic particles is repelled off the substrate B and is drawn by the surface tension into the region formed the lyophilic particles. Hence, as in the case of the liquid-repellent particles, even if the position onto which the droplet is dropped is slightly displaced, the droplet 81 is moved to the desired region without fail, with the result that it is possible to stably form a fine pattern. The lyophilic particles are fixed to the substrate B, and thus the droplet 81 can be securely fixed to the substrate B.

What is claimed is:

1. A method of manufacturing a pattern substrate in which a pattern is formed on a substrate so as to locate a component in a predetermined position on a surface of the substrate by a surface tension of a liquid member, comprising:
    forming a predetermined pattern on a surface of a particle carrying member with particles, the particles being liquid-repellent or lyophilic particles;
    transferring the particles in the predetermined pattern from the particle carrying member to the substrate such that the transferred particles in the predetermined pattern form is one of a liquid-repellent region and a lyophilic region with respect to the other region on the substrate; and
    contacting the liquid member to the predetermined pattern on the substrate, wherein
    when the particles are the liquid-repellent particles, the liquid member has an angle of contact with the liquid-repellent particles which is more than an angle of contact with the substrate, and
    when the particles are the lyophilic particles, the liquid member has an angle of contact with the lyophilic particles which less than an angle of contact with the substrate.

2. The method of manufacturing a pattern substrate according to claim 1, wherein the particles are the liquid-repellent particles, and the predetermined pattern is formed from the liquid-repellent region on the substrate.

3. The method of manufacturing pattern substrate according to claim 1,
    wherein a step of forming the predetermined pattern with the particles on the surface of the particle carrying member is such that an electrostatic latent image of the predetermined pattern is formed on the particle carrying member, that the particles are charged and electrically moved to the electrostatic latent image, and that the predetermined pattern is formed from the particles on the surface of the particle carrying member.

4. The method of manufacturing a pattern substrate according to claim 3,
wherein the particle carrying member includes photoconductive layer, and after the particle carrying member is uniformly charged, the electrostatic latent image of the predetermined pattern is formed by exposure on the surface of the particle carrying member.

5. The method of manufacturing a pattern substrate according to claim 3,
wherein a step in which the predetermined pattern is transferred from the particle carrying member to the substrate is such that a voltage of a polarity opposite to a charge polarity of the particles is applied from a side of the substrate opposite to side of the particle carrying member and that the predetermined pattern is electrically transferred from the particle carrying member to the substrate.

6. The method of manufacturing a pattern substrate according to claim 1,
wherein the predetermined pattern is formed on the substrate with an ink jet application unit by the liquid-repellent or lyophilic particles.

7. A method of locating a component in a predetermined position on a surface of a substrate by a surface tension of a liquid member,
wherein the liquid member is applied to the pattern substrate manufactured by the manufacturing method according to claim 1, and the component is arranged such that at least a part of a surface of the component opposite the pattern substrate is brought into contact with the liquid member to which the predetermined pattern is applied.

8. The method of locating a component according to claim 7, wherein an angle of contact of the liquid member with a liquid-repellent region is greater than an angle of contact with a lyophilic region and an angle of contact of the component with the surface opposite the substrate.

9. The method of locating a component according to claim 7, wherein the predetermined pattern is a negative pattern, and a height of the liquid member applied to the substrate is higher than a height of a liquid-repellent material.

10. The method of locating a component according to claim 7, wherein the predetermined pattern is a negative pattern, and a liquid-repellent material is formed so as not to make contact with the component.

11. The method of locating a component according to claim 7, wherein the surface of the component opposite the substrate is subjected to lyophilic processing.

12. The method of locating a component according to claim 7, wherein a lyophilic region on the pattern substrate is similar to the surface of the component opposite the substrate.

13. The method of locating a component according to claim 7, wherein the liquid member has water as a main ingredient.

14. A method of locating a component in predetermined position on a surface of a substrate by a surface tension of a liquid member,
wherein the liquid member is applied to at least a part of a surface of the component opposite the substrate, and the component is arranged such that at least a part of the liquid member applied is brought into contact with a lyophilic region on the pattern substrate manufactured by the manufacturing method according to claim 1.

15. The method of locating a component according to claim 14, wherein an angle of contact of the liquid member with a liquid-repellent region is greater than an angle of contact with the lyophilic region and an angle of contact of the component with the surface opposite the substrate.

16. The method of locating a component according to claim 14, wherein the predetermined pattern is a negative pattern, and a height of the liquid member applied to the substrate is higher than a height of a liquid-repellent material.

17. The method of locating a component according to claim 14, wherein the predetermined pattern is a negative pattern, and a liquid-repellent material is formed so as not to make contact with the component.

18. The method of locating a component according to claim 14, wherein the surface of the component opposite the substrate is subjected to lyophilic processing.

19. The method of locating a component according to claim 18, wherein a region of the component subjected to the lyophilic processing is the part of the surface opposite the substrate.

20. The method of locating a component according to claim 14, wherein a lyophilic region on the pattern substrate is similar to the surface of the component opposite the substrate.

21. The method of locating a component according to claim 19, wherein a lyophilic region on the pattern substrate is similar to the region of the component subjected to the lyophilic processing.

22. The method of locating a component according to claim 14, wherein the liquid member has water as a main ingredient.

* * * * *